(12) United States Patent
Salm (10) Patent No.: US 10,775,031 B2
(45) Date of Patent: *Sep. 15, 2020

(54) LIGHTING APPARATUS (71) Applicant: GLP German Light Products GmbH, Karlsbad (DE)

(72) Inventor: Markus Salm, Heusweiler (DE)

(73) Assignee: GLP German Light Products GmbH, Karlsbad (DE)

(*) Notice: Subject to any disclaimer, the term of this patent is extended or adjusted under 35 U.S.C. 154(b) by 0 days.

This patent is subject to a terminal disclaimer.

(21) Appl. No.: 15/894,600

(22) Filed: Feb. 12, 2018

(65) Prior Publication Data

US 2018/0238527 A1 Aug. 23, 2018

Related U.S. Application Data (63) Continuation of application No. 14/690,086, filed on Apr. 17, 2015, now Pat. No. 9,909,745.

(30) Foreign Application Priority Data

Mar. 19, 2015 (DE) .................. 10 2015 205 003

(51) Int. Cl.
*F21V 21/30* (2006.01)
*F21V 21/15* (2006.01)
(Continued)

(52) U.S. Cl.
CPC .............. *F21V 21/30* (2013.01); *F21V 21/15* (2013.01); *F21Y 2103/10* (2016.08); *F21Y 2115/10* (2016.08)

(58) Field of Classification Search
None
See application file for complete search history.

(56) References Cited

U.S. PATENT DOCUMENTS 7,950,821 B1 5/2011 Georgitsis et al.
9,909,745 B2 * 3/2018 Salm ..................... H05K 7/186
(Continued)

FOREIGN PATENT DOCUMENTS

CN 103697386 A 4/2014
CN 203656629 U 6/2014
(Continued)

OTHER PUBLICATIONS

"Cuepix Strip Trit", www.elationlighting.com; Los Angeles, CA, 1997-2017, 1-2.
(Continued)

*Primary Examiner* — Sharon E Payne
(74) *Attorney, Agent, or Firm* — Michael A. Glenn; Perkins Coie LLP (57) ABSTRACT Embodiments provide an illumination device comprising an elongated base and a pivotable elongated illumination unit. Said pivotable elongated illumination unit is mounted to be pivotable about a longitudinal axis by means of at least one joint. Both the elongated base and the pivotable elongated illumination unit extend in parallel with said longitudinal axis. In particular, the longitudinal extension of the pivotable elongated illumination unit is limited by two opposing lateral faces. The illumination unit includes at least two illumination elements arranged along the pivotable axis, so that a distance between two neighboring light emitting elements corresponds to 1.5 to 2.5 times the distance between a light emitting element that is positioned adjacently to a lateral face and the corresponding lateral face.

19 Claims, 6 Drawing Sheets (51) Int. Cl.
*F21Y 103/10* (2016.01)
*F21Y 115/10* (2016.01)

(56) References Cited

U.S. PATENT DOCUMENTS

| | | | |
|---|---|---|---|
| 2002/0047003 | A1 | 4/2002 | Bedingham et al. |
| 2005/0287661 | A1 | 12/2005 | Landers |
| 2008/0002413 | A1 | 1/2008 | Wang et al. |
| 2008/0068839 | A1* | 3/2008 | Matheson ............... F21S 2/005 362/249.07 |
| 2009/0109670 | A1* | 4/2009 | Boyer ................... F16B 5/0258 362/234 |
| 2009/0225546 | A1 | 9/2009 | Pearson et al. |
| 2011/0194287 | A1* | 8/2011 | Georgitsis ............ B60Q 1/0483 362/277 |
| 2013/0271977 | A1 | 10/2013 | Ronen et al. |
| 2014/0321135 | A1 | 10/2014 | Chen et al. |
| 2015/0003099 | A1 | 1/2015 | Rasmussen et al. |

FOREIGN PATENT DOCUMENTS

| | | |
|---|---|---|
| DE | 102007056280 B3 | 7/2009 |
| DE | 202010002018 U1 | 5/2010 |
| DE | 102010002018 A1 | 8/2011 |
| EP | 1821030 A1 | 8/2007 |
| EP | 2843303 A1 | 3/2015 |
| FR | 2981432 A1 | 4/2013 |
| JP | 49025272 U | 3/1974 |
| JP | 2002163922 A | 6/2002 |
| JP | 2012009280 A | 1/2012 |
| JP | 2013089503 A | 5/2013 |
| JP | 2014170640 A | 9/2014 |
| WO | 2011/162323 A1 | 12/2011 |
| WO | 2013/100859 A1 | 7/2013 |
| WO | 2014/132530 A1 | 9/2014 |

OTHER PUBLICATIONS

"Elar Quad Bar", http://www.elationlighting.eu/de/elar-quad-bar.html, 1997-2017, 1-2.
"Show-Batten 100", 2011; Clay Paky SpA P.IVA 006328101064; http://www.elationlighting.com/, 2011, 1-2.
"Six Bar 1000", http://www.elationlighting.eu/en/six-bar-1000.html, 1997-2017, 1-2.
Kim, Hanyoup et al., "Nanodroplet real-time PCR system with laser assisted heating", Molecular Physics Laboratory and Biosciences Division, SRI International, Menlo Park, CA, Optical Society of America, Jan. 5, 2009, 10 pages.

* cited by examiner

LIGHTING APPARATUS

CROSS REFERENCE TO RELATED APPLICATIONS

This application is a Continuation of U.S. patent application Ser. No. 14/690,086, filed Apr. 17, 2015, which claims priority to German Application No. 10 2015 205 003.3, filed Mar. 19, 2015, which are each incorporated herein in its entirety by this reference thereto.

Embodiments of the present invention relate to a lighting apparatus, also referred to as illumination device, as well as a system including two illumination devices.

As far as illumination devices are concerned, a differentiation is made between systems having movable illumination heads and fixed systems. Systems having movable illumination heads typically include a base, or a stationary unit, and an illumination unit pivotable in relation to the base. The illumination unit typically includes one or more light emitting elements such as, e.g., bulbs, LEDs or other illuminants by means of which a light cone can be generated which has an orientation predefined by the housing, or the opening of the housing. In order to align the light cone, the entire illumination unit is typically arranged to be pivotable in relation to the base by means of one or more joints; the pivoting operation can be effected either manually or via remote control.

Both with the fixed systems and the systems having movable illumination heads, a differentiation is made between single spots and arrays. It is possible, by means of arrays, to achieve uniform illumination at least across a two-dimensional area. However, since the size of the area to be illuminated changes frequency, the flexibility of such arrays is highly restricted, which is why in many fields of application, one eventually resorted to spots again, which are then positioned individually adjacently to one another in a laborious manner, so that uniform illumination can occur. This is why there is a need for an improved approach.

It is the object of the present invention to provide a device and/or a system that can be employed in a flexible manner while allowing a large degree of two-dimensional illumination.

The object is achieved by the subject matter of the claims.

Embodiments of the present invention provide an illumination device comprising an elongated base and a pivotable elongated illumination unit. Said pivotable elongated illumination unit is mounted to be pivotable about a longitudinal axis by means of at least one joint. Both the elongated base and the pivotable elongated illumination unit extend in parallel with said longitudinal axis. In particular, the longitudinal extension of the pivotable elongated illumination unit is limited by two opposing lateral faces. The illumination unit includes at least two illumination elements arranged along the pivotable axis, so that a distance between two neighboring light emitting elements corresponds to 1.5 to 2.5 times the distance between a light emitting element that is positioned adjacently to a lateral face and the corresponding lateral face.

In accordance with further embodiments, a system comprising at least two illumination devices is provided, as was already described above. In this context, a distance between two light emitting elements positioned adjacently to the mutually adjacent lateral faces of the two illumination devices corresponds to 0.5 to 1.5 times the distance between two neighboring light emitting elements of one of the two illumination devices.

Therefore, embodiments of the present invention are based on the finding that uniform illumination can be achieved by means of a system which includes a plurality of elongated illumination devices, each of which has a plurality of light emitting elements arranged along the longitudinal axis, when the individual elongated illumination devices are configured such that a distance between the individual light emitting elements remains essentially constant even when several elongated illumination devices are strung together. To ensure this, the distance between a light emitting element arranged on the edge, i.e. adjacently to the next illumination device, and the respective exterior surface of the illumination device is selected as a function of a distance between two neighboring light emitting elements within the illumination device itself. As was already indicated above, this results in that, as soon as two or more illumination devices are arranged in series, i.e. directly adjacently to one another, the distances across the plurality of light emitting elements of the illumination devices remain more or less the same.

Further embodiments of the present invention provide an illumination device which includes laterally arranged legs having one joint each, whereby the engagement between the elongated base and the pivotable elongated illumination unit is effected, or pivotability is realized. Said legs may also be configured as bearing blocks comprising rotational joints.

In accordance with preferred embodiments, the pivotable elongated illumination unit comprises a recess for each bearing block and/or each leg. For example, the lateral face of the pivotable elongated illumination unit may join up flush with or be set back from the respective bearing block, so that the entire longitudinal extension of the illumination device is predefined by the lateral faces of the pivotable elongated illumination unit. As a result, this means that the elongated base preferably has a longitudinal extension that is smaller than or, at the most, equal to an area of the pivotable elongated illumination unit. This geometric arrangement has proved to be advantageous in relation to the desired stringing together of several illumination devices. The recesses mentioned above additionally offer the advantage that elements relevant in terms of illumination such as optics, for example, can be arranged in a protruding area, i.e. such that it overlaps with the recess and the leg arranged within the recess.

In accordance with further embodiments, the illumination device is preferably pivotable by at least 180° or more. This can be realized, for example, in that the above-mentioned leg or, generally, the base is configured in a wasted manner. The pivot movement may also be effected by means of remote control via a control panel, or generally by means of remote control via a corresponding interface. To this end, the illumination device includes means for motorized pivoting of the pivotable elongated illumination unit. Said means may include, for example, a motor arranged within the elongated base, a pinion fixedly coupled to the pivotable elongated illumination unit, and/or a drive belt.

As was already indicated above, each elongated illumination unit includes a multitude of illumination elements such as LEDs, for example, that are arranged, or, in particular, regularly arranged, along the longitudinal extension of the pivotable elongated illumination unit.

In accordance with further embodiments, the individual illumination elements may be coupled to lenses that enable focused radiation in the form of an illumination cone. In accordance with further embodiments, the lenses may additionally also be configured to focus the illumination cone. Here, a distance between the illumination element and the respective lens will then be varied. The distance may be set in a motorized manner or manually.

In accordance with further embodiments, the several lenses for the several illumination elements may also be configured as a lens array, i.e. in one unit. In this context, a distance between two neighboring lenses will then be selected such that it corresponds to 1.5 to 2.5 times the distance between a lens positioned adjacently to the lateral face and the corresponding lateral face.

While referring back to the above embodiment with the recess for the leg and/or the bearing block, it shall be noted that in accordance with further embodiments, the lens arranged on the edge may be arranged such that it overlaps with said recess and, thus, overlaps with the leg and/or the bearing block.

Embodiments of the present invention will be explained below with reference to the accompanying figures, wherein.

Before embodiments of the present invention will be explained in detail below with reference to the figures, it shall be noted that elements and structures having identical actions are provided with identical reference numerals, so that their descriptions are mutually applicable and/or exchangeable.

Figure 1:
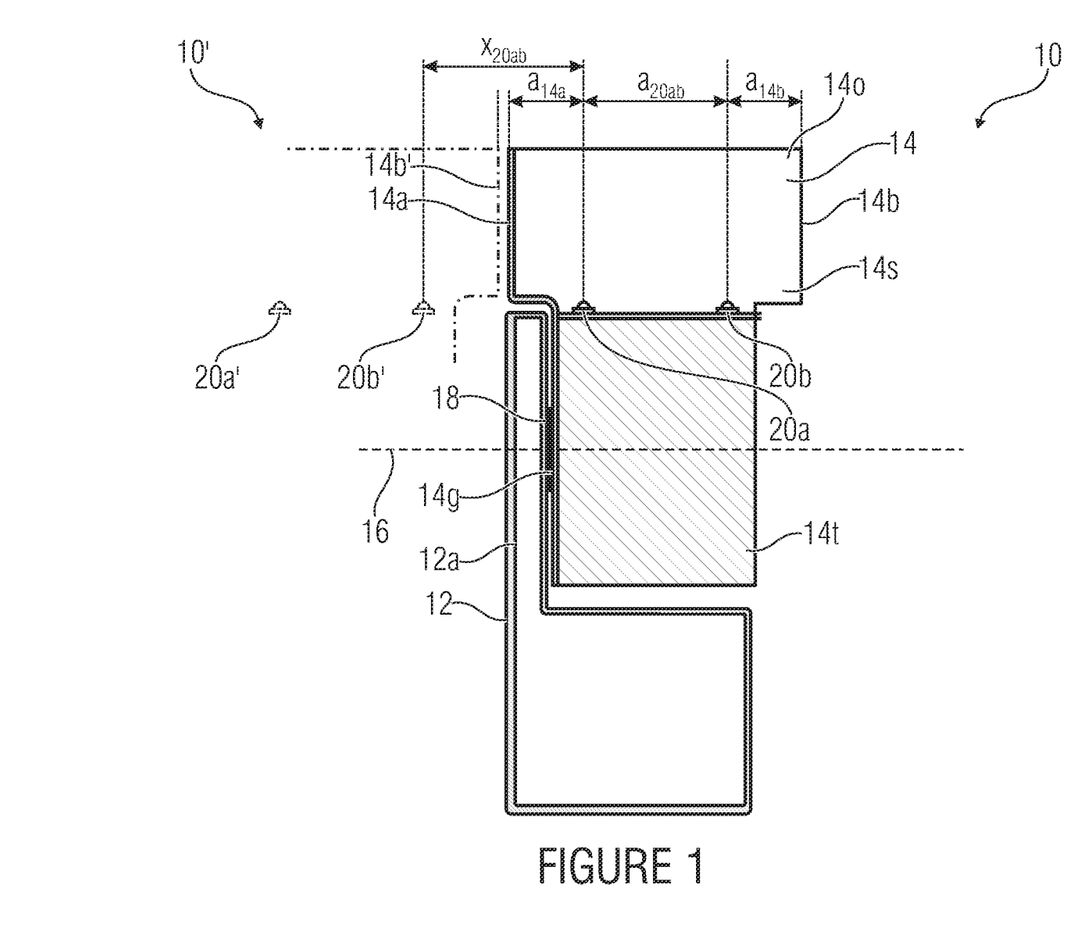
FIG. 1 shows a schematic representation of an illumination device in accordance with a first embodiment.

FIG. 1 shows an illumination device 10 comprising an elongated base 12 and a pivotable elongated illumination unit 14. The pivotable elongated illumination unit 14 is mounted to be pivotable about the longitudinal axis 16. To this end, the illumination device includes a joint 18. The joint may be configured as a rotational joint or a different type of joint, so that a pivotal movement of the illumination unit 14 is enabled.

Both the base 12 and the illumination unit are formed as elongated elements, both of which extend in parallel with the longitudinal axis 16. The longitudinal extension in particular of the pivotable elongated illumination unit 14 is limited by two opposing lateral faces 14a and 14b. The elongated illumination unit 14 normally comprises a rectangular base body, the lateral walls of which are the very lateral faces 14a and 14b, whereas so-called longitudinal faces are arranged between said faces 14a and 14b. The at least two light emitting elements 20a and 20b are arranged along the longitudinal extension (in parallel with the longitudinal axis 16).

The light emitting elements 20a and 20b are arranged while considering specific specifications regarding distance. In accordance with said specifications, the distance $x_{20ab}$ between two neighboring light emitting elements 20a and 20b is approximately 1.5 to 2.5 times a distance $a_{14a}$ between one of the lateral faces 14a and the nearest light emitting element 20a. It shall be noted that the distance $a_{14b}$ (between 20b and 14b) may be taken as the reference distance. In accordance with preferred embodiments, the distance $x_{20ab}$ is even only 1.9 to 2.1 times the distance $a_{14a}$ and $a_{14b}$, respectively. Even though on the basis of production tolerances, which always exist, this is not possible, it is nevertheless the goal, in accordance with further embodiments, that the distance $x_{20ab}$ be precisely double the distance $a_{14a}$ and $a_{14b}$, respectively. All of said conditions in terms of distance, specifically, result in that when the illumination device 10 is employed in combination with a further illumination device 10' (here depicted in dashed lines), the distance $x_{20ab}$ of adjacently arranged light emitting elements of the two illumination devices 10 and 10'—here, for example, 20b' and 20a, is roughly the same as the distance $a_{30ab}$. This results in a regular arrangement, or distribution, of the light emitting elements 20a, 20b, 20a', 20b'. Therefore, uniform illumination is advantageously achieved due to said regular arrangement; additionally, a scalability of the system (10+10') exists due to the fact that the number of the illumination devices 10, 10' to be employed is varied. Since the illumination devices 10 are set up next to one another or such that they abut each other, handling is very simple. It shall be noted at this point that the regular arrangement across the several illumination devices 10 and 10' is typically obtained, or is obtained to an even greater extent, when the lateral faces 14a and 14b' are adjacent to one another or even contact one another.

In accordance with further embodiments, each of the illumination devices, or, to be precise, each elongated illumination unit, comprises a multitude of illumination elements. Said illumination elements may all be arranged along the longitudinal extension. As was already indicated above, regular arrangement is preferred in terms of light distribution. Thus, an approximately constant distance $a_{20ab}$ is desired within an illumination unit 14. Here, 0.75 to 1.25 or even 0.9 to 1.1 times the one distance as compared to another distance is regarded as essentially constant.

Depending on the embodiment, the engagement between the pivotable elongated illumination unit 14 and the base 12 may be configured differently. In the embodiment depicted in FIG. 1, the engagement is effected by means of a rotational joint arranged between a leg 12a of the base 12 and an area 14t of the illumination unit 14.

In accordance with embodiments, the illumination unit 14 is provided with a recess 14g in the area 14t, so that the leg 12a and the area 14t, through which the pivot axis 16 extends, can be arranged next to each other without impairing the overall dimensions of the illumination device 10. In detail, the depth of the recess 14g in the longitudinal direction exceeds the width of the leg 12a, so that the leg 12a and the lateral face 14a join up flush with each other or that the surface of the leg 12a is set back in relation to the lateral face 14a. To join up flush is understood to mean to join up such that the faces (14a and surface of the leg 12a) are arranged with a maximum offset of 1 mm or 5 mm. By means of said flush or set back join-up, several illumination devices 10 and 10' can be arranged next to one other such that they are directly adjacent to one another.

Each illumination device preferably, but not necessarily, includes two lateral parts, or laterally arranged legs, 12a, between which the area 14t of the illumination unit 14 is arranged.

Figure 2A:
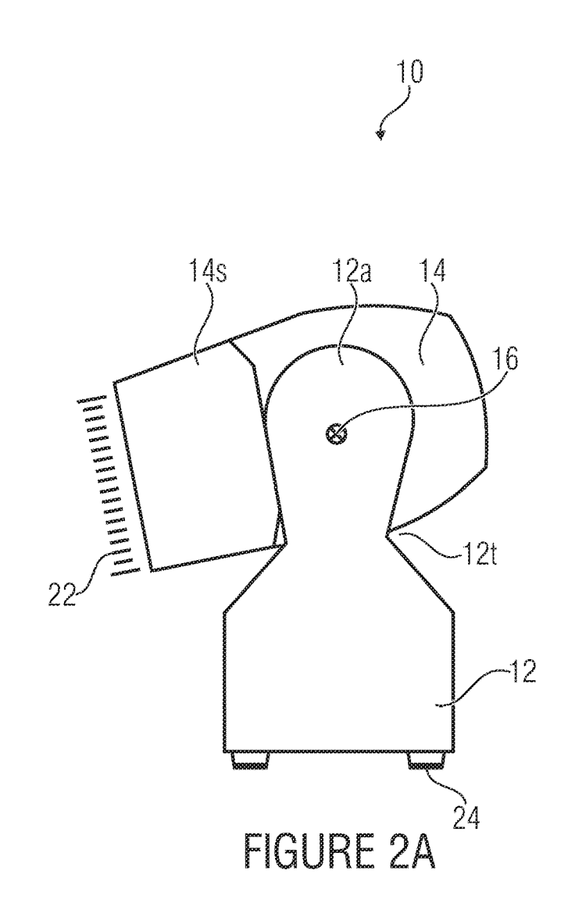
FIGS. 2a-c show a schematic lateral view of an illumination device in accordance with a further embodiment in three different pivot positions.
Figure 2B:
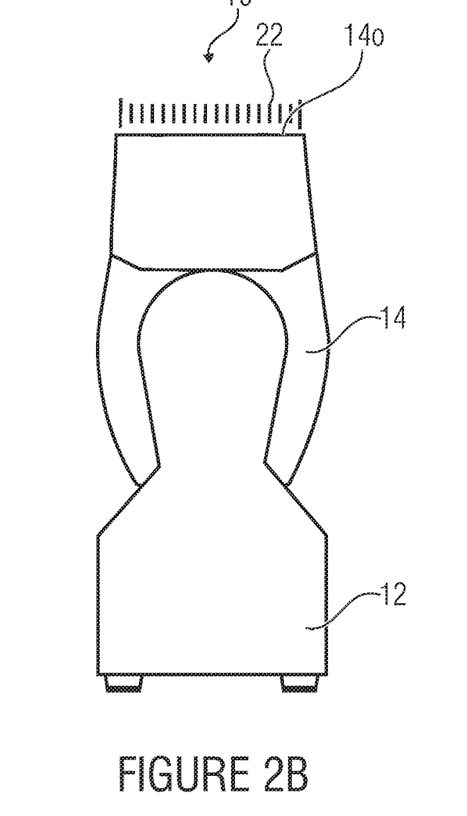
Figure 2C:
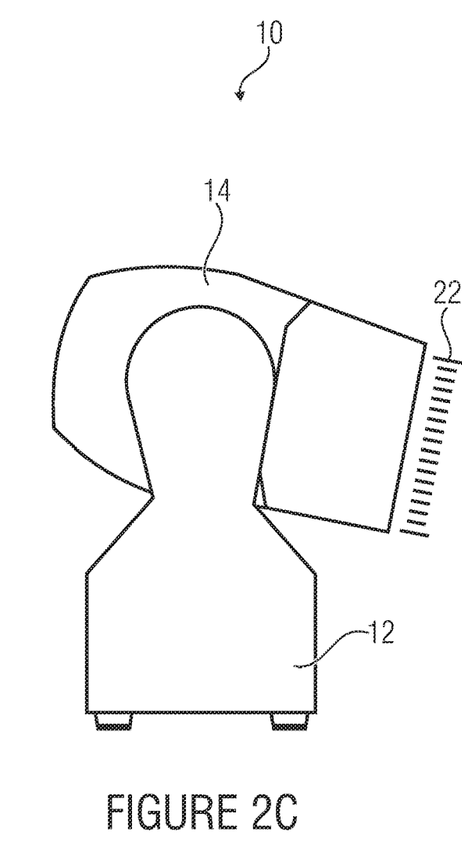

FIGS. 2a-2c show lateral views of the illumination device 10 with the base 12 and the pivotable elongated illumination unit 14. The base 12 here again includes the laterally arranged leg 12a, which may also be referred to as a bearing block.

In FIGS. 2a-2c, the illumination device is pivoted to a different direction in each case, so that the light cone 22 is directed either to the left (FIG. 2a), upward (FIG. 2b), or to the right (FIG. 2c). The light cone 22, or its direction, is predefined by the opening 14o (see also FIG. 1). One can also see from FIG. 1, in this respect, that all of the illumination elements 20a and 20b face toward said opening 14o.

Starting from the above explained recess 14g of the illumination unit 14, some kind of protrusion 14s of the illumination unit 14 arises in the area of the opening 14o (cf. also FIG. 1). Due to this protrusion 14s, the mobility or pivotability of the illumination unit 14 may be restricted. To avoid this restriction, the leg 12a is shaped accordingly. Specifically, said leg on the one hand has a round shape curved around the longitudinal axis 16, so that pivoting of the illumination unit 14 is enabled. On the other hand, the leg 12a also comprises waisting 12t, so that the range of angles within which the illumination unit 14 can be pivoted can be increased. Here, the range of angles may preferably include at least 180°, if not more than that, such as 210°, for example.

Figure 3A:
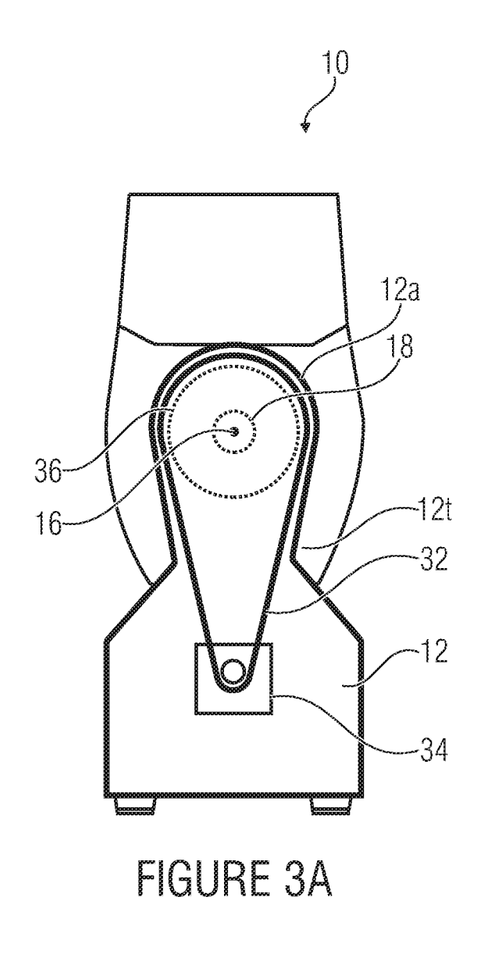
FIG. 3a shows a schematic detailed view of the illumination device of FIGS. 2a-c, the focus being on the means for pivoting.

With reference to FIGS. 3 and 4, two partial aspects of the above embodiments shall be explained below. FIG. 3a shows the illumination device 10 of FIG. 2, the base 12 and/or in particular, the leg 12a being depicted in sectional manner. Said leg 12a serves as a bearing block and thus supports the bearing 18, sliding bearing or ball bearing. For example, a shaft, which extends along the pivot axis 16 and is coupled to the illumination unit 14, engages into the bearing. As is depicted here, means are provided for performing motorized pivoting of the illumination unit 14 about the longitudinal axis 16. The means may include a drive belt 32 and a motor 34, for example, whose interaction causes the illumination unit 14 to be pivotable about the axis 16.

Therefore, the illumination unit 14 comprises engagement portions 36, e.g. a pulley fixedly coupled to the illumination unit 14. The motor 34 may be configured as a stepper motor or as a stepper motor having a high resolution. The belt 32 encloses the pulley 36 (output pinion 36) and the motor pinion 34. By means of the arrangement/enclosing action of the belt 32 and the pulley 36, the waisting 12t is also predefined, as becomes clear from FIG. 3a, in particular. The arrangement of the motor 34, the belt 32 and the pinion 36, which is supported by the bearing 18, also becomes clear from FIGS. 4a and 4b. One can recognize here that the leg 12a is configured to be as narrow as possible, limits being set here, in particular, by the width of the bearing 18 and/or of the belt 32. In addition, however, one can also see that it is advantageous to arrange the motor 34 within the base since, consequently, the width of the leg 12a is not impaired by the former. In other words, the arrangement of the motor 34 inside the base may be described by the fact that the former is arranged below the element 14t of the illumination unit 14 in the front view.

Figure 3B:
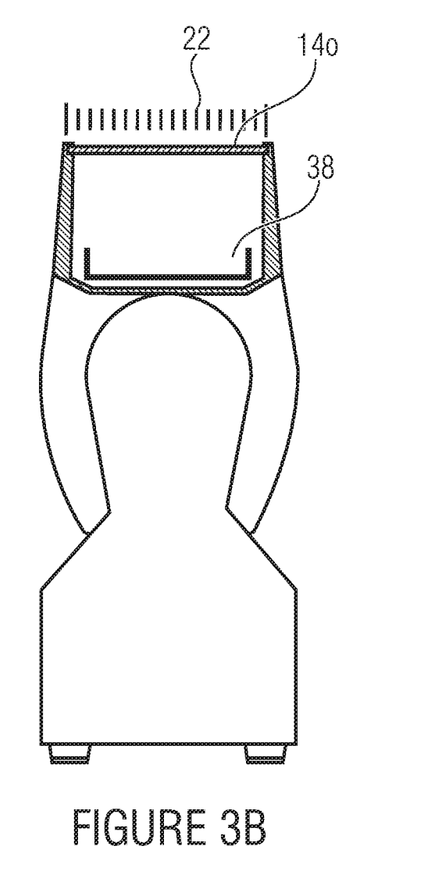
FIGS. 3b-c show a schematic detailed view of the illumination device of FIGS. 2a-c, the focus being on the optics.
Figure 3C:
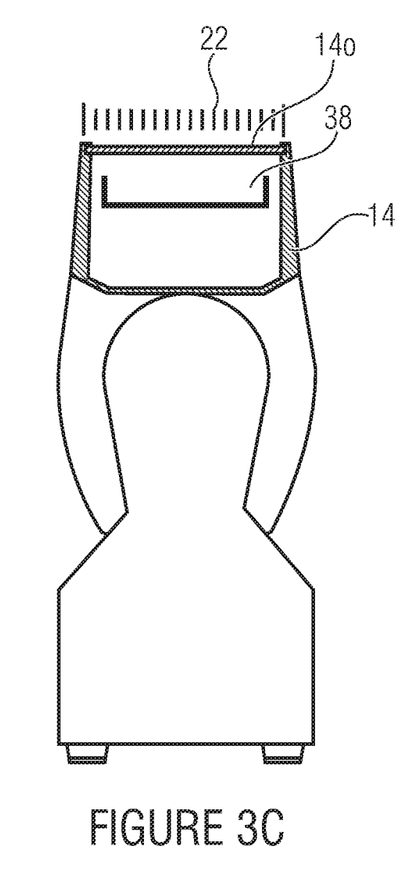
Figure 4A:
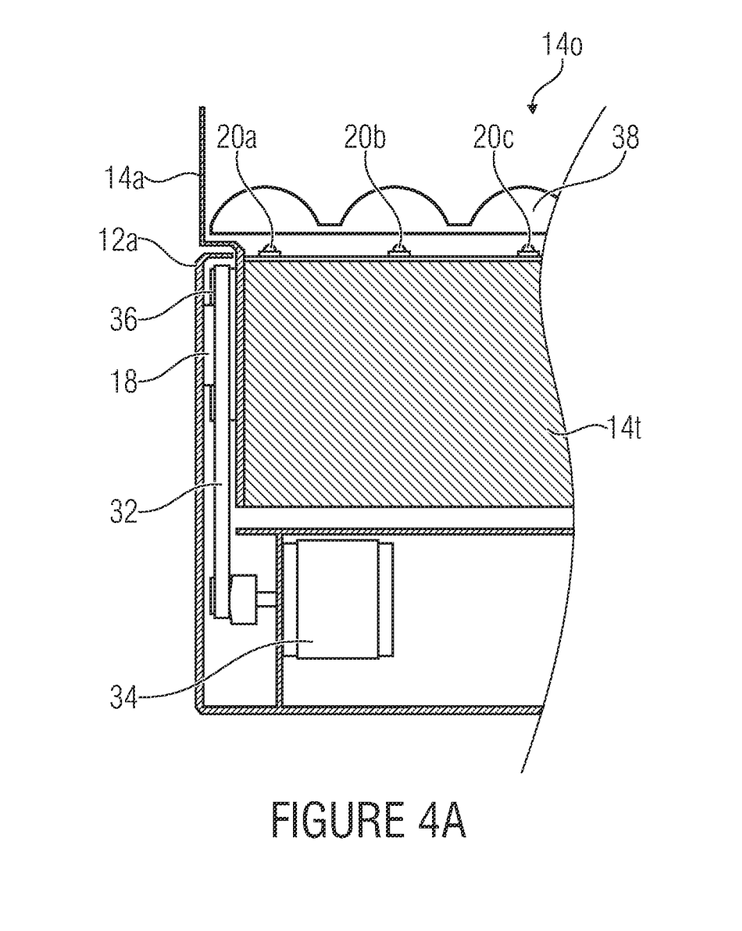
FIGS. 4a-b show schematic sectional views of the illumination device of FIGS. 2a-c, the focus being on the means for pivoting.
Figure 4B:
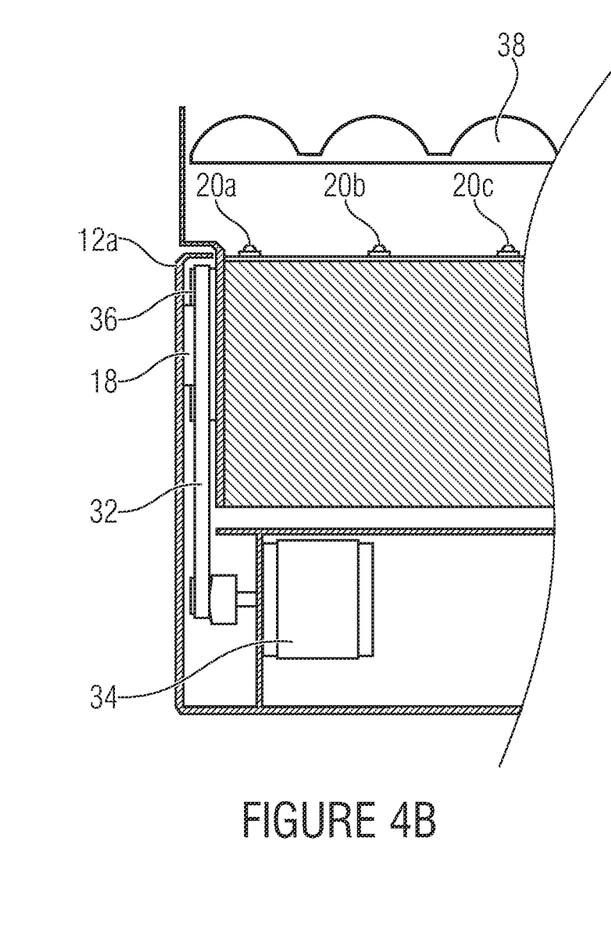

In accordance with further embodiments, the illumination device or, in particular, the illumination unit 14, comprises optics 38 such as a lens or a lens array, for example. The lens array 38 may include, e.g., several lenses arranged next to one another, each lens being associated with a light emitting element 20a, 20b, and 20c (cf. FIGS. 3b and 3c and/or FIGS. 4a and 4b). The lens or lens array 38 is arranged between the light emitting elements 20a, 20b, and 20c and the opening 14o. The lens elements 38 enable focusing of the light cone 22 by varying the distance between the lens 38 and the light emitting elements 20a, 20b, and 20c. In this manner, a zoom area of 7° to 50° may be achieved, for example, the adjustment of same preferably being effected in a motorized manner such that the overall lens array 38 is shifted. One setting of the zoom optics 38 is shown in FIGS. 3b and 4a, respectively, for example, which enables a wider light cone 22. This setting may also be referred to as a wide-angle setting. FIGS. 4b and 3c, respectively, depict the so-called "spot setting", which enables a highly focused light cone 22. It is also possible for individual lenses or diffusion disks of the overall lens array 38 to be exchangeable.

It becomes clear in particular from FIG. 4 that it is advantageous to displace the center of rotation of the illumination head (cf. axis 60) further to the back in relation to the optics so as to thus provide sufficient installation space for the optics inclusive of the adjustment mechanism (not shown). As a result, it is also possible for a lens of the lens array 38 to partially overlap with the leg 12a (at least in the lateral view). This is desired since in this manner, the optical areas protrude close up to the edge (cf. lateral faces 14a), so that protrusion is possible without any light gap even when several illumination devices are strung together (cf. FIG. 1). Due to the overlap of the arrangement of the lens array 38 with the leg 12a it is possible for the light emitting elements (LEDs) to also be arranged in an area 14t of the illumination unit which is arranged between the legs, i.e. not in the widened protruding illumination head section, since it is obviously only in the event of the spot setting that the light beams of the last LED in the series widen up to the full width of the zoom lens. The size or width of the opening 14o is selected such that projection is also possible in the wide-angle setting without any separation on account of the housing 14.

In accordance with further embodiments, the lens distances of the lens array 38 are constant. This means, therefore, that a lens distance between two lenses preferably corresponds to 0.75 to 1.25 times or even 0.9 to 1.1 times a lens distance between two further lenses. As was also explained above with regard to the distance of the light emitting element 20a from the lateral face 14a and/or from the lateral face 14b, the lens distance of the lens arranged on the edge from the lateral face 14a is to be selected to be approximately 0.5 (0.35 to 0.65) times the distance between two lenses.

Figures 5A, 5B:
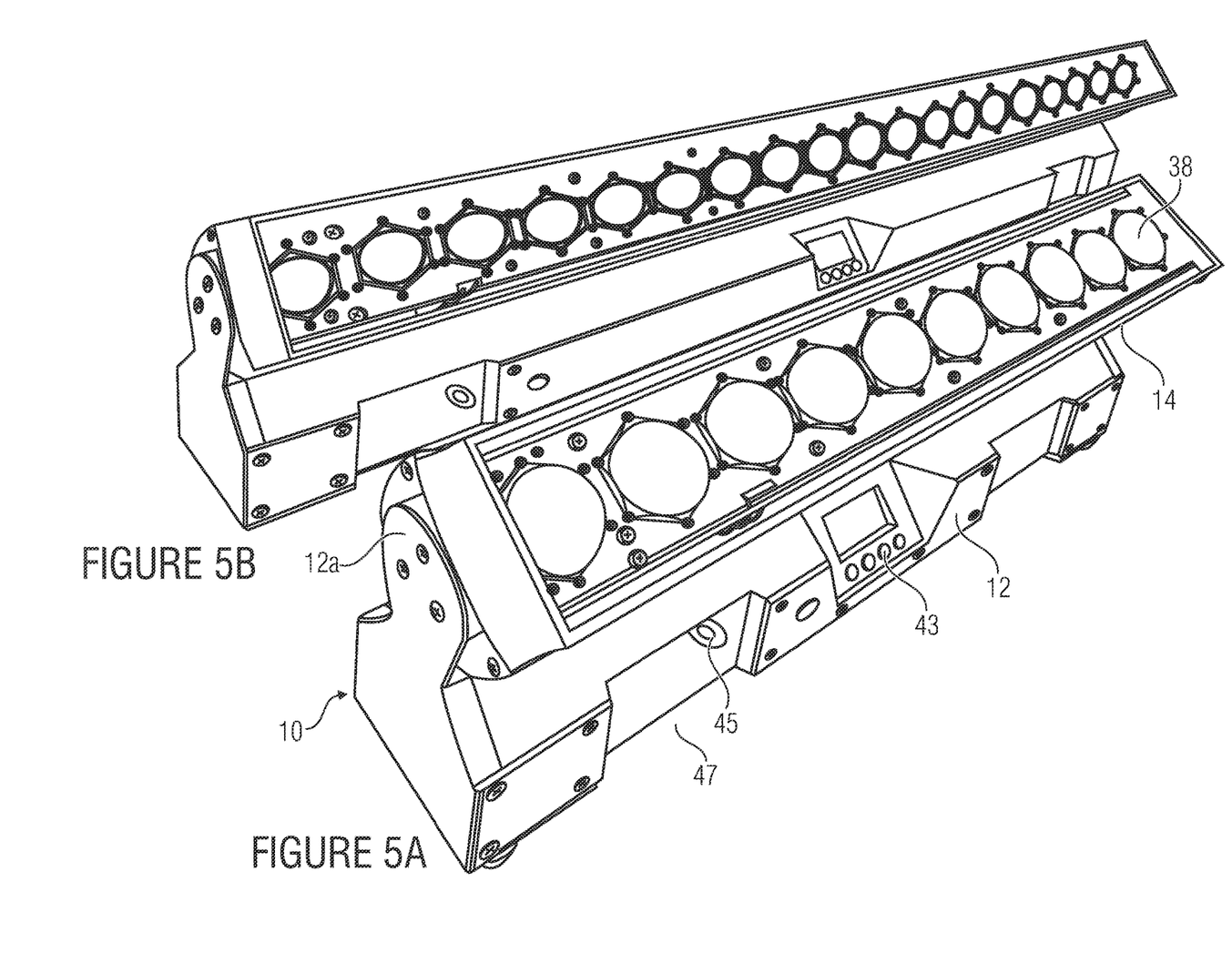
FIGS. 5a and 5b show embodiments of an inventive illumination device.

FIG. 5a shows a first example of application of the illumination device 10 comprising an elongated illumination unit 14 which in total includes 10 illumination elements arranged in series. Said illumination elements, which may be high-power RGBW LEDs, for example, are not visible here since they are arranged behind the lenses of the lens array 38. The base 12 is also configured as an elongated element having two legs 12a. As can be seen, the longitudinal extension of the base 12 is, at the most, as large as the illumination unit 14, but may preferably be smaller. Depending on the configuration, a controller comprising an illuminated graphic display 43 and/or an interface for current supply and/or for remote control (e.g. via a protocol such as DMX-512, for example) may be provided inside the base 12. In this embodiment, the interface for remote control 45 is arranged in a depressed area 47, so that the width extension is not influenced by any cables that may be connected. For example the pivoting action, adjustment of the zoom or activation or deactivation of further effects, such as the stroboscope effect, the pulse effect, individual activation or deactivation of individual pixels or LEDs, color variation for each LED, but also the feedback and/or possible error messages, are effected via the control panel 43 and/or via the remote control protocol.

Figure 5C:
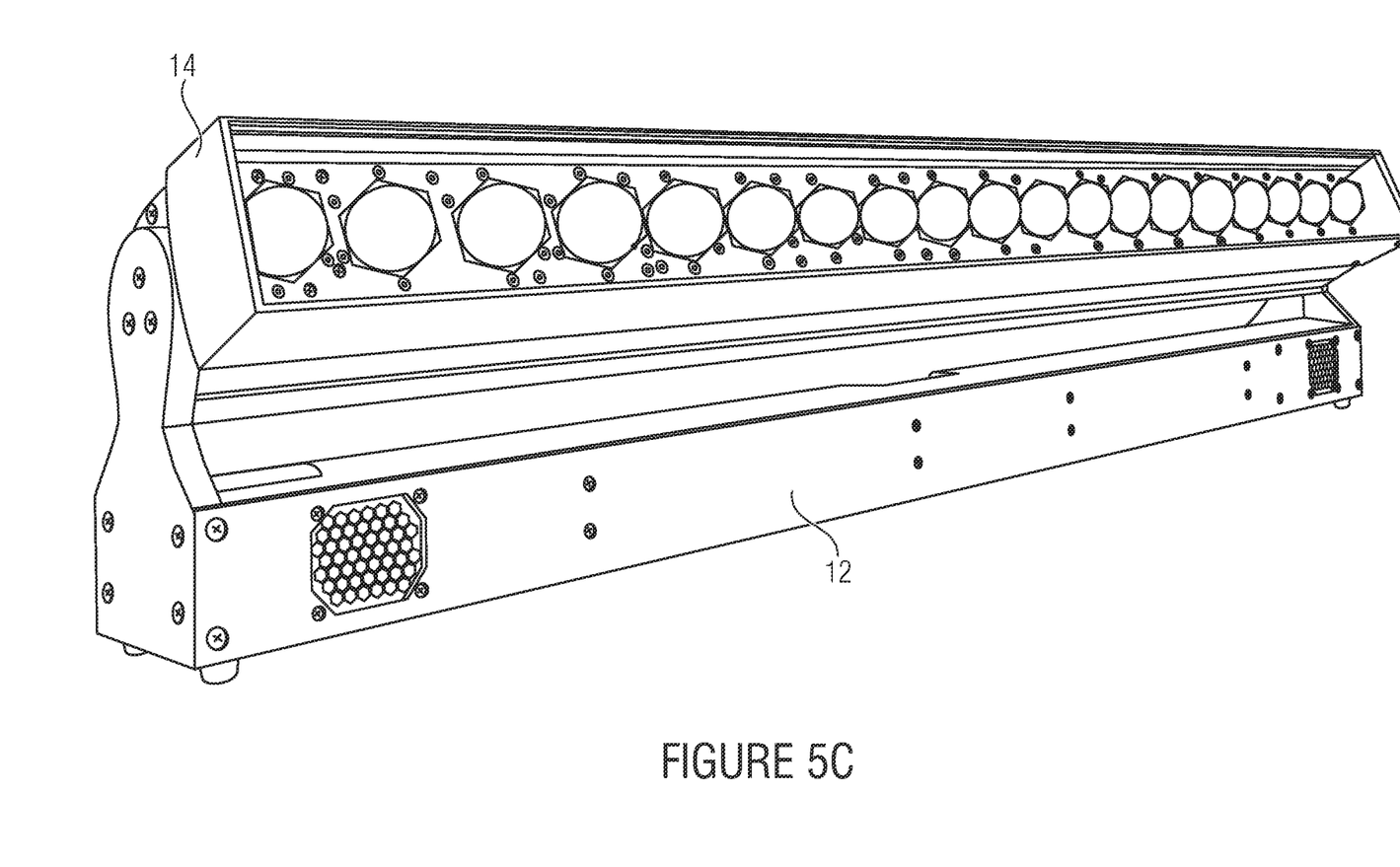
FIG. 5c shows a rear view of the embodiment of FIG. 5b.

FIG. 5b shows a further illumination device 10 having double the length and double the number of light emitting elements. With regard to the further features, the illumination device of FIG. 5b corresponds to the illumination device of FIG. 5a. FIG. 5c shows a rear view, here the rear view of the illumination device of FIG. 5b. In this rear view, the base 12 does not include the control panel 43 and/or terminal 45, but cooling openings 49 that serve to cool the drive 34 (not depicted). As can be seen in this view, in particular, both the base 12 and the illumination unit 14 are configured as a screwed construction.

With reference to FIG. 1 it shall be noted that a further embodiment of the present invention, namely the system including at least the two illumination devices 10 and 10', is also depicted here.

With reference to FIG. 1 it shall be noted that the leg 12a and/or the joint 18 need not necessarily be configured as a laterally arranged leg, but can also be configured as a centrally arranged leg.

With regard to FIG. 1 it shall further be noted that the faces 14a and 14b and 14b', respectively, may be plane or curved or have a different shape.

In accordance with embodiments, the illumination devices 10 and 10' may also be connected to each other so as to serve as positioning aids. The connection may be effected via the lateral faces of the legs 12a/12b or via the face 14a to the face 14b'. To this end, either a flange or pin or a further connecting means may be configured on said faces.

With regard to the above-mentioned embodiments it shall be noted that even though the arrangement of the multitude of illumination units was always depicted in such a manner that they must extend along the longitudinal extension, i.e. on a common axis, this is not necessarily the case. For example, the arrangement of the light emitting elements may also be effected in several rows, e.g. offset in each case, or in several rows and in parallel in each case. In addition, a light emitting element may also be formed by a plurality of luminous units, such as a plurality of LEDs. In order to determine the distance between the individual light emitting units, what is aimed at is always the point of maximum intensity in the illumination distribution and/or the center of the light emitting element/lens, depending on the configuration of the light emitting elements. Thus, it is also readily possible to meet the above-indicated requirements for arranging non-spot-shaped, or planar, light emitting elements.

With reference to FIG. 2: in accordance with embodiments, the base is primarily configured for vertical operation and therefore includes the feet/rubber feet 24. Alternatively, fastening may also be effected by means of clamps (or other fastening points). Additionally, lugs for security fastening may also be provided. In accordance with further embodiments, threads may also be provided instead of the feet 24, so that suspended mounting is also possible. Irrespective of the type of fastening, it is possible to seamlessly string together several illumination devices 10 and 10' while maintaining the pixel distance (regular arrangement of the light emitting elements 20a and 20b).

With reference to FIGS. 3b and 3c it shall be noted that the opening 14o may be closed by a transparent pane such as an acrylic glass pane or glass pane, for example.

In accordance with embodiments, a cooling unit may be provided in the area 14t or, preferably, across the entire surface of the area 14t for cooling the light emitting elements. Generally, it is also possible for active cooling, e.g. by means of fans, to be provided for cooling the light emitting unit and/or a controller and/or a pivot mechanism.

The invention claimed is:

1. An illumination device (10, 10') comprising:
an elongated base (12) extending in parallel with a longitudinal axis (16);
a pivotable elongated illumination unit (14) extending in parallel with the longitudinal axis (16), the longitudinal extension of the pivotable elongated illumination unit (14) being limited by two opposing lateral faces;
the pivotable elongated illumination unit (14) being mounted to be pivotable about the longitudinal axis (16) by means of at least one joint (18), and
the pivotable elongated illumination unit (14) including at least two light emitting elements arranged along the pivotable elongated illumination unit (14) such that a distance ($a_{20ab}$) between two neighboring light emitting elements corresponds to 1.5 to 2.5 the distance ($a_{14a}$, $a_{14b}$) between a light emitting element positioned adjacently to one of the lateral faces (14a, 14b) and the corresponding lateral face (14a, 14b),
wherein the illumination device (10, 10') including two laterally arranged legs (12a) each comprising a joint (18) by means of which the pivotable elongated illumination unit (14) is engaged with the elongated base (12), wherein each illumination element (20a, 20b, 20c) is coupled to at least one lens (38) wherein the lens (38) neighboring a lateral face (14a, 14b) at least partly overlaps one of the legs (12a).

2. The illumination device (10, 10') as claimed in claim 1, wherein the elongated base (12) includes two laterally arranged bearing blocks (12a), wherein the joints (18) are rotational joints, and wherein the pivotable elongated illumination unit (14) is arranged between the bearing blocks (12a) and is engaged with same via the rotational joints.

3. The illumination device (10, 10') according to claim 1, wherein the elongated base (12) includes two laterally arranged bearing blocks (12a) and wherein the pivotable elongated illumination unit (14) comprises one recess (14g) in each case for the respective bearing block (12a).

4. The illumination device (10, 10') as claimed in claim 3, wherein the recess (14g) is configured such that the lateral faces (14a, 14b) of the pivotable elongated illumination unit (14) join up flush with lateral faces of the bearing blocks (12a) or the lateral faces of the bearing blocks (12a) are set back in relation to the lateral faces (14a, 14b) of the pivotable elongated illumination unit (14).

5. The illumination device (10, 10') according to claim 1, wherein the elongated base (12) has a smaller or, at the most, equal-sized longitudinal extension than that of the pivotable elongated illumination unit (14).

6. The illumination device (10, 10') according to claim 1, wherein the pivotable elongated illumination unit (14) is pivotable about the longitudinal axis (16) by at least 180 degrees or more.

7. The illumination device (10, 10') as claimed in claim 1, wherein the elongated base (12) or the legs (12a) are waisted, so that the pivotable elongated illumination unit (14) is pivotable by at least 180 degrees or more.

8. The illumination device (10, 10') according to claim 1, the illumination device (10, 10') further including means for motorized pivoting of the pivotable elongated illumination unit (14).

9. The illumination device (10, 10') as claimed in claim 8, wherein the means for pivoting include a motor (34) arranged inside the elongated base (12), a pinion (36) fixedly coupled to the elongated pivotable illumination unit (14), and/or a drive belt (32).

10. The illumination device (10, 10') according to claim 1, the illumination device (10, 10') comprising a multitude of regularly arranged illumination elements (20a, 20b, 20c).

11. The illumination device (10, 10') according to claim 1, wherein the illumination elements (20a, 20b, 20c) are LEDs.

12. The illumination device (10, 10') according to claim 1, wherein the pivotable elongated illumination unit (14) includes a cooling unit (14t).

13. The illumination device (10, 10') as according to claim 1, wherein the at least two light emitting elements are configured to emit a light cone (22) perpendicularly to the longitudinal axis, and wherein the at least two light cones (22) are pivoted along with the pivotable elongated illumination unit (14).

14. The illumination device (10, 10') as claimed in claim 1, wherein a distance between the illumination element (20a, 20b, 20c) and the respective lens (38) is variable, so that a light cone (22) of the respective illumination element (20a, 20b, 20c) is focusable.

15. The illumination device (10, 10') as claimed in claim 1, wherein the pivotable elongated illumination unit (14) includes a lens array (38) configured as a unit, and wherein a distance ($a_{20ab}$) between two neighboring lenses (38) of the lens array (38) corresponds to 1.5 to 2.5 times the distance ($a_{14a}$, $a_{14b}$) between a lens (38) positioned adjacently to the lateral face (14a, 14b) and the corresponding lateral face (14a, 14b).

16. The illumination device (10, 10') according to claim 1, wherein the base (12) includes a control panel (43).

17. The illumination device (10, 10') according to claim 1, wherein the base (12) includes a depression (47) comprising a connection terminal (45).

18. The illumination device (10, 10') according to claim 1, wherein the device includes an interface via which the illumination device (10, 10') can be remote controlled.

19. A system (10+10') comprising at least two illumination devices (10, 10') as claimed in claim 1 which are mutually adjacent via respective lateral faces (14a, 14b), wherein a distance ($a_{14a}$, $a_{14b}$) between two light emitting elements positioned adjacently to the mutually adjacent lateral faces (14a, 14b) of the two illumination devices (10, 10') corresponds to 0.5 to 1.5 times the distance ($a_{20ab}$) between two neighboring light emitting elements of one of the two illumination devices (10, 10').

* * * * *